United States Patent
Happoya et al.

(10) Patent No.: US 9,595,646 B2
(45) Date of Patent: Mar. 14, 2017

(54) ELECTRONIC COMPONENT AND ELECTRONIC UNIT

(71) Applicant: KABUSHIKI KAISHA TOSHIBA, Minato-ku (JP)

(72) Inventors: Akihiko Happoya, Ome (JP); Daigo Suzuki, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/564,521

(22) Filed: Dec. 9, 2014

(65) Prior Publication Data

US 2016/0035948 A1 Feb. 4, 2016

(30) Foreign Application Priority Data

Jul. 31, 2014 (JP) .................................. 2014-156690

(51) Int. Cl.

| | | |
|---|---|---|
| H01L 33/54 | (2010.01) | |
| H01L 33/38 | (2010.01) | |
| H01L 33/48 | (2010.01) | |
| H01L 33/50 | (2010.01) | |
| H01L 33/56 | (2010.01) | |
| H01L 33/62 | (2010.01) | |
| H01L 33/44 | (2010.01) | |

(52) U.S. Cl.
CPC ............ *H01L 33/54* (2013.01); *H01L 33/385* (2013.01); *H01L 33/44* (2013.01); *H01L 33/486* (2013.01); *H01L 33/505* (2013.01); *H01L 33/56* (2013.01); *H01L 33/62* (2013.01); *H01L 2224/13599* (2013.01)

(58) Field of Classification Search
CPC ......... H01L 33/60; H01L 33/20; H01L 33/62; H01L 33/54; H01L 33/44
See application file for complete search history.

(56) References Cited

U.S. PATENT DOCUMENTS

| | | | |
|---|---|---|---|
| 2001/0036711 A1* | 11/2001 | Urushima | ............. H01L 21/563 438/460 |
| 2002/0180019 A1* | 12/2002 | Saito | ..................... G01L 19/142 257/684 |
| 2007/0071885 A1* | 3/2007 | Kumagai | ........................ 427/66 |
| 2007/0269925 A1 | 11/2007 | Shchekin et al. | |
| 2010/0140640 A1* | 6/2010 | Shimokawa | ........ H01L 33/0079 257/98 |

(Continued)

FOREIGN PATENT DOCUMENTS

| | | | |
|---|---|---|---|
| EP | 2 194 586 A1 | 6/2010 | |
| EP | 2 657 999 A2 | 10/2013 | |

(Continued)

OTHER PUBLICATIONS

Partial European Search Report, issued Nov. 30, 2015 to European Patent Application No. 15154294.1

*Primary Examiner* — Allen Parker
*Assistant Examiner* — Long Le
(74) *Attorney, Agent, or Firm* — Oblon, McClelland, Maier & Neustadt, L.L.P.

(57) ABSTRACT

According to one embodiment, an electronic component includes a metal portion, a mold resin covering at least a part of the metal portion, and a molecular adhesion layer provided between a surface of the metal portion and the mold resin.

17 Claims, 7 Drawing Sheets

(56) References Cited

U.S. PATENT DOCUMENTS

| | | | |
|---|---|---|---|
| 2010/0244224 A1* | 9/2010 | Tanaka | H01L 21/563 257/690 |
| 2011/0163345 A1 | 7/2011 | Fukunaga | |
| 2011/0198645 A1* | 8/2011 | Jo | H01L 33/44 257/98 |
| 2011/0298001 A1* | 12/2011 | Akimoto | H01L 33/44 257/99 |
| 2012/0248405 A1* | 10/2012 | Tu | H01L 33/44 257/13 |
| 2013/0248910 A1* | 9/2013 | Kimura | H01L 25/167 257/98 |
| 2014/0134797 A1* | 5/2014 | Chi | H01L 24/96 438/107 |
| 2014/0295589 A1 | 10/2014 | Lindberg et al. | |

FOREIGN PATENT DOCUMENTS

| | | |
|---|---|---|
| JP | 2009-302081 | 12/2009 |
| WO | 2013/017466 A1 | 2/2013 |

* cited by examiner

ELECTRONIC COMPONENT AND ELECTRONIC UNIT

CROSS-REFERENCE TO RELATED APPLICATIONS

This application is based upon and claims the benefit of priority from Japanese Patent Application No. 2014-156690, filed Jul. 31, 2014, the entire contents of which are incorporated herein by reference.

FIELD

Embodiments described herein relate generally to an electronic component and an electronic unit.

BACKGROUND

There has been proposed a method of manufacturing circuit components, which forms an electrically conductive circuit by electroless plating, with the application of a functional molecular adhesive.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

DETAILED DESCRIPTION

Embodiments will be described hereinafter with reference to the accompanying drawings.

In general, according to one embodiment, an electronic component comprises a metal portion, a mold resin covering at least a part of the metal portion, and a molecular adhesion layer provided between a surface of the metal portion and the mold resin.

In this specification, some elements are each expressed by two or more terms. These terms are merely examples and the above-mentioned elements may be expressed by another or other terms. The other elements, which are not expressed by two or more terms, may be expressed by another or other terms.

Also, the drawings are merely examples, and may differ from when the embodiments are actually realized in terms of, for example, the relationship between thickness and planar dimension and the ratio of thickness of layers. Further, in the drawings, the relationship or ratio of dimensions may be different from figure to figure.

First Embodiment

Figure 1:
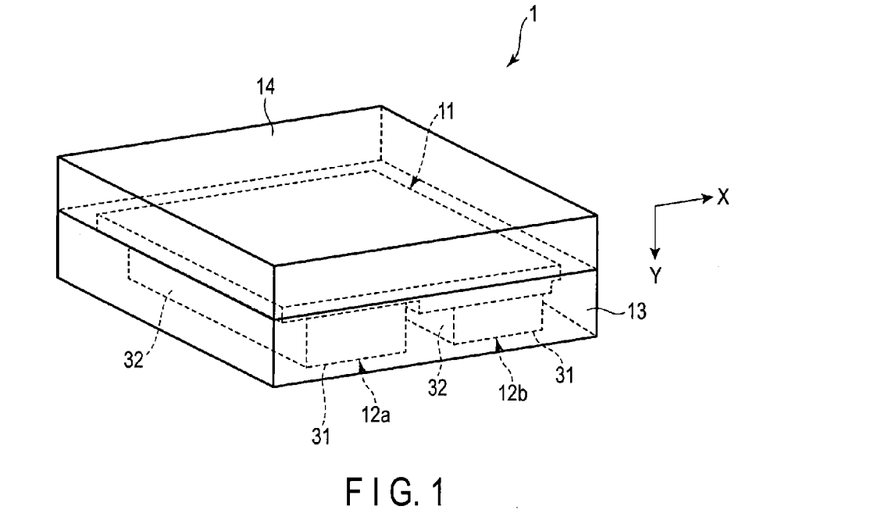
FIG. 1 is a perspective view of an electronic component according to a first embodiment.
Figure 2:
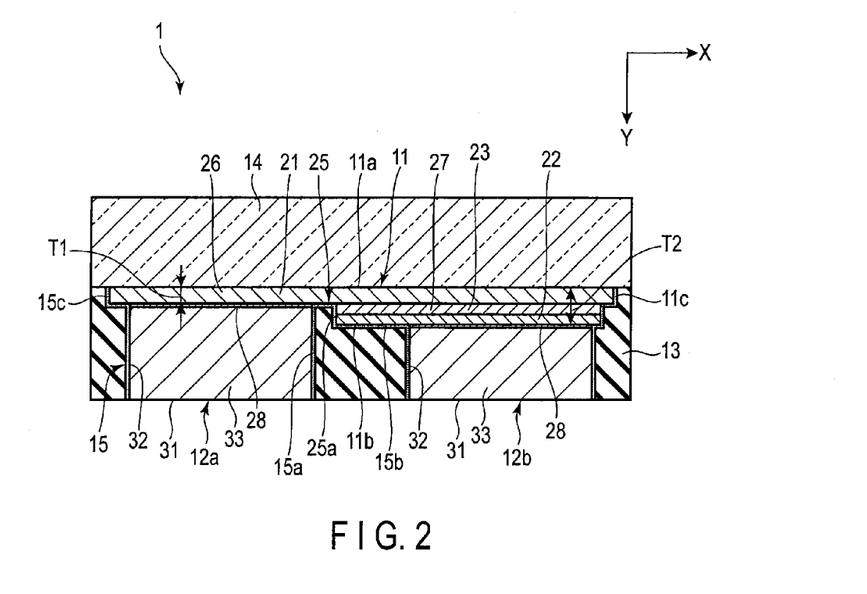
FIG. 2 is a cross-sectional view of the electronic component shown in FIG. 1.

FIG. 1 and FIG. 2 show an electronic component 1 according to a first embodiment. The electronic component 1 is an example of each of a semiconductor component, a semiconductor package, a package, an electronic unit, an electronic apparatus, an electronic system, and a system. The electronic component 1 is, for example, an LED chip of a wafer level package (i.e., wafer level chip-size package [wafer level CSP]), but is not limited to this. A structure of the present embodiment can be widely applied to various electronic components other than an LED chip.

As shown in FIG. 1 and FIG. 2, the electronic component 1 comprises a light-emitting device 11, a plurality of metal electrodes 12a and 12b, a mold resin 13, a fluorescent layer 14, and a molecular adhesion layer 15. The light-emitting device 11 (e.g., a semiconductor light-emitting device, a light-emitting layer, a light-emitting portion) is an example of each of a semiconductor device, a main body portion, a component main body, and a device portion, and is, for example, a light-emitting diode (LED). A semiconductor device, a main body portion or a component main body to which the present embodiment is applicable is not limited to a light-emitting device, and may be an element having other functions. The light-emitting device 11 is formed in the shape of a substantially rectangular thin film (thin plate) in planar view.

The light-emitting device 11 includes, for example, an InGaN layer which emits blue light. More specifically, the light-emitting device 11 comprises, for example, a first cladding layer 21, a second cladding layer 22 and an active layer 23. Each of the first cladding layer 21, the second cladding layer 22, and the active layer 23 is formed in the shape of a substantially rectangular thin film in planar view.

The first cladding layer 21 is, for example, a layer of an n-type semiconductor, and has, for example, a width close to a substantially full width of the electronic component 1. The second cladding layer 22 is a layer of a p-type semiconductor. The second cladding layer 22 has a smaller area than that of the first cladding layer 21, and is provided at a position shifted from a center of the first cladding layer 21.

The active layer 23 has, for example, substantially the same outer shape as that of the second cladding layer 22, and is provided between the first cladding layer 21 and the second cladding layer 22. The active layer 23 emits light when an electrical potential difference is given between the first cladding layer 21 and the second cladding layer 22. The light-emitting device 11 thereby emits, for example, blue light. The light-emitting device 11 may also emit light other than blue light. In addition, the light-emitting device 11 may comprise a light-reflecting layer covering a bottom surface of the second cladding layer 22.

As shown in FIG. 2, the light-emitting device 11 comprises a first surface 11a (e.g., first principal surface), a second surface 11b (e.g., second principal surface) and a third surface 11c (e.g., side surface). The first surface 11a is a top surface in FIG. 2, and is formed by a surface of the first cladding layer 21. The second surface 11b is a bottom surface in FIG. 2, and is located on the opposite side to the first surface 11a. The second surface 11b is formed by a part of the surface of the first cladding layer 21 and a surface of the second cladding layer 22. The second surface 11b extends substantially parallel to the first surface 11a, and comprises a step portion 25, which will be described later, in the middle thereof. The third surface 11c extends in a substantially orthogonal direction to the first surface 11a and the second surface 11b, and connects an edge of the first surface 11a and an edge of the second surface 11b.

The light-emitting device 11 comprises a first portion 26 and a second portion 27 differing in thickness from each other. The first portion 26 is located at a region separated from the second cladding layer 22, and has a first thickness T1 substantially equal to the thickness of the first cladding layer 21. The second portion 27 includes the first cladding layer 21, the second cladding layer 22 and the active layer 23, and has a second thickness T2 greater than the first thickness T1. The step portion 25 is located between the first portion 26 and the second portion 27, and is formed by a difference in thickness between the first portion 26 and the second portion 27. The step portion 25 includes a standing surface 25a extending in the thickness direction of the light-emitting device 11.

As shown in FIG. 2, the second surface 11b of the light-emitting device 11 may comprise a seed layer 28. The seed layer 28 is, for example, an electrically conductive film which serves as a power feeding layer when the metal electrodes 12a and 12b are formed by plating. The seed layer 28 is formed by, for example, a laminated film such as Ti/Cu.

As shown in FIG. 1 and FIG. 2, the metal electrodes 12a and 12b are provided on the second surface 11b of the light-emitting device 11, and are connected to the light-emitting device 11. Each of the metal electrodes 12a and 12b is an example of a metal portion. The metal electrodes 12a and 12b project from the second surface 11b of the light-emitting device 11 in the thickness direction of the light-emitting device 11 (in a substantially orthogonal direction to the second surface 11b of the light-emitting device 11) in the shape of a pillar of a substantially rectangular parallelepiped or a cylinder. It should be noted that "being provided on (connected to) the light-emitting device 11" includes "being provided at (connected to) the light-emitting device 11 with the seed layer 28 therebetween".

Each of the first and second metal electrodes 12a and 12b comprises an end surface 31 and a peripheral surface 32 (i.e., side surface). The end surface 31 is a projecting surface of each of the metal electrodes 12a and 12b located on the opposite side to the light-emitting device 11, and is substantially parallel to the second surface 11b of the light-emitting device 11. The peripheral surface 32 extends in the projection direction of the metal electrodes 12a and 12b, and connects a peripheral edge of the end surface 31 and the light-emitting device 11.

In the present embodiment, the metal electrodes 12a and 12b include the first electrode 12a (e.g., n-electrode) and the second electrode 12b (e.g., p-electrode). The first electrode 12a is provided at the first portion 26 of the light-emitting device 11, and is electrically connected to the first cladding layer 21. On the other hand, the second electrode 12b is provided at the second portion 27 of the light-emitting device 11, and is electrically connected to the second cladding layer 22. The light-emitting device 11 thereby can be fed with power through the metal electrodes 12a and 12b. A material for the metal electrodes 12a and 12b is, for example, a metal such as copper, aluminum, silver, gold, tin, nickel, lead solder or lead-free solder, and is preferably, copper.

Here, each of the first and second metal electrodes 12a and 12b may include an electrode film and a metal post 33. An electrode film (i.e., electrode layer) is located at a base portion of each of the metal electrodes 12a and 12b, and is provided on the second surface 11b (or the seed layer 28) of the light-emitting device 11. The electrode film is formed of a metal such as Ni/Au in, for example, a thickness of 0.1 µm.

On the other hand, the metal post 33 greatly projects from the electrode film in the thickness direction of the light-emitting device 11, and occupies most of each of the metal electrodes 12a and 12b. The metal post 33 is formed of a metal such as copper. Also, the above-described electrode film may be omitted. That is, each of the metal electrodes 12a and 12b may be composed of only the metal post 33. Thus, the term "metal electrode" in the present specification may be read as "metal post" appropriately.

As shown in FIG. 1 and FIG. 2, the mold resin 13 (i.e., sealing resin, insulating resin, resin portion) is provided to surround the metal electrodes 12a and 12b, and forms a part of the outer shape of the electronic component 1. The mold resin 13 covers at least a part of the light-emitting device 11 and at least a part of the metal electrodes 12a and 12b. More specifically, the mold resin 13 exposes the end surfaces 31 of the first and second metal electrodes 12a and 12b to the outside, and covers substantially all the peripheral surfaces 32 of the first and second metal electrodes 12a and 12b.

A part of the mold resin 13 is located between the first electrode 12a and the second electrode 12b to insulate the first electrode 12a and the second electrode 12b from each other, and covers the second surface 11b of the light-emitting device 11. A part of the mold resin 13 covers the step portion 25 of the light-emitting device 11 (covers, for example, the standing surface 25a of the step portion 25). In addition, another part of the mold resin 13 reaches a side of the light-emitting device 11, and covers the third surface 11c (i.e., side surface) of the light-emitting device 11.

The second surface 11b of the light-emitting device 11 may comprise an insulating passivation film in a region not overlapping with the first and second metal electrodes 12a and 12b, but this passivation film may be omitted.

A material for the mold resin 13 is, for example, a thermosetting resin or an ultraviolet cursing resin, but is not limited to these. The thermosetting resin is, for example, an epoxy resin, a silicone resin, a urethane resin, a phenolic resin, a melamine resin, a urea resin, an unsaturated polyester resin, or a polyimide resin, and is preferably, an epoxy resin or a silicone resin. The epoxy resin is, for example, a glycidyl ester-based epoxy resin, a linear aliphatic epoxide-based epoxy resin, an alicyclic epoxide-based epoxy resin, a glycidyl ether-based epoxy resin, or a glycidyl amine-based epoxy resin, and is preferably, a glycidyl ester-based epoxy resin, a linear aliphatic epoxide-based epoxy resin, or an alicyclic epoxide-based epoxy resin. The silicone resin is, for example, a methylphenyl silicone or a dimethylphenyl silicone, and is preferably, a methylphenyl silicone. The mold resin 13 need not be a single composition but may be a mixture of two or more kinds of resin. Also, the mold resin 13 may contain a filler. The filler is, for example, silica, but is not limited to this, and an insulating material such as talc and alumina may be used appropriately.

As shown in FIG. 1 and FIG. 2, the first surface 11a of the light-emitting device 11 is provided with the fluorescent layer 14. The fluorescent layer 14 is an example of each of a light-transmitting portion and, a light-transmitting layer.

The first surface 11a of the light-emitting device 11 is covered by the fluorescent layer 14. The fluorescent layer 14 constitutes, for example, a part of the outer shape of the electronic component 1. The fluorescent layer 14 is formed of a resin into which particles of a fluorescent material converting blue light into long-wavelength light are mixed, and covers substantially all the first surface 11a of the light-emitting device 11. The light-transmitting portion and the light-transmitting layer provided in the electronic component 1 may be a colorless light-transmitting layer instead of the fluorescent layer 14.

Next, the molecular adhesion layer 15 (i.e., molecular bond layer, adhesive molecular layer) according to the present embodiment will be described. It should be noted that "molecular adhesion" in the present specification means adding a compound serving as a molecular adhesive between two objects for adhesion and making these two objects adhere (i.e., join) to each other by a chemical bond.

As shown in FIG. 2, the molecular adhesion layer 15 exists between the surfaces of the metal electrodes 12a and 12b and the mold resin 13, and the like, and makes the surfaces of the metal electrodes 12a and 12b and the mold resin 13 adhere (i.e., join, adhesively bond, chemically bond) to each other. The thickness of the molecular adhesion layer 15 is, for example, one nanometer to several nanometers.

The molecular adhesion layer 15 is formed by adding a molecular adhesive (e.g., functional molecular adhesive, molecular joining material) to the surfaces of the metal electrodes 12a and 12b, and the like. An example of molecular adhesive is a thiol-reactive alkoxysilane compound represented by general formula (C1) below.

(C1)

In the formula, $R^1$ is a hydrogen atom or a hydrocarbon group. The hydrocarbon group is, for example, $CH_3$—, $C_2H_5$—, n-$C_3H_7$—, n-$C_4H_9$—, $C_6H_{11}$—, $CH_2$=$CHCH_2$—, or $C_6H_5$—.

In the formula, $R^2$ is a hydrocarbon chain or a hydrocarbon chain which may contain a heteroatom or a functional group. The heteroatom is, for example, a sulfur atom or a nitrogen atom. The functional group is, for example, a carbamoyl group or a urea group.

Such $R^2$ is, for example, —$CH_2CH_2$—, —$CH_2CH_2CH_2$—, —$CH_2CH_2CH_2CH_2CH_2CH_2$—, —$CH_2CH_2SCH_2CH_2$—, —$CH_2CH_2CH_2SCH_2CH_2CH_2$—, —$CH_2CH_2NHCH_2CH_2CH_2$—, —$(CH_2CH_2)_2NCH_2CH_2CH_2$—, —$C_6H_4$—, —$C_6H_4C_6H_4$—, —$CH_2C_6H_4CH_2$—, —$CH_2CH_2CH_2CH_2CH_2CH_2CH_2CH_2CH_2CH_2$—, —$CH_2CH_2OCONHCH_2CH_2CH_2$—, —$CH_2CH_2NHCONHCH_2CH_2CH_2$—, or —$(CH_2CH_2)_2CHOCONHCH_2CH_2CH_2$—.

In the formula, X is a hydrogen atom or a hydrocarbon group. The hydrocarbon group is, for example, $CH_3$—, $C_2H_5$—, n-$C_3H_7$—, i-$C_3H_7$—, n-$C_4H_9$—, i-$C_4H_9$—, or t-$C_4H_9$—.

In the formula, Y is an alkoxy group. The alkoxy group is, for example, $CH_3O$—, $C_2H_5O$—, n-$C_3H_7O$—, i-$C_3H_7O$—, n-$C_4H_9O$—, i-$C_4H_9O$—, or t-$C_4H_9O$—.

In the formula, n is an integer from 1 to 3.

In the formula, M is an alkali metal. The alkali metal is, for example, Li, Na, K or Cs.

Examples of such a thiol-reactive alkoxylane compound include 6-(3-triethoxysilylpropylamino)-1,3,5-triazine-2,4-dithiol monosodium salt (TES), which contains a dithiol triazinyl group and a triethoxysilyl group in the molecule. The molecular adhesive need not be a single composition but may be a mixture of two or more kinds. Also, the above-described composition of the molecular adhesive has been presented by way of example only, and the molecular adhesive of the present embodiment is not limited to the above-described example.

As shown in FIG. 2, in the present embodiment, the molecular adhesion layer 15 comprises a first portion 15a, a second portion 15b, and a third portion 15c. Here, an X-direction and a Y-direction are defined. The X-direction is a direction substantially parallel to the first surface 11a of the light-emitting device 11 and is a direction from the first electrode 12a to the second electrode 12b. The Y-direction is a direction crossing (for example, substantially orthogonal to) the X-direction, and is the thickness direction of the light-emitting device 11.

The first portion 15a exists between each of the peripheral surfaces 32 (i.e., side surface) of the metal electrodes 12a and 12b and the mold resin 13, and extends in the Y-direction. The first portion 15a is formed in substantially the whole area of the peripheral surfaces 32 of the metal electrodes 12a and 12b. The first portion 15a makes the peripheral surfaces 32 of the metal electrodes 12a and 12b and the mold resin 13 adhere to each other by a molecular bond.

The second portion 15b exists between the second surface 11b of the light-emitting device 11 and the mold resin 13, and extends in the X-direction. The second portion 15b is provided, for example, in substantially the whole area of the second surface 11b except the metal electrodes 12a and 12b. The second portion 15b makes the second surface 11b of the light-emitting device 11 and the mold resin 13 adhere to each other by a molecular bond.

In addition, a part of the second portion 15b is located, for example, between a surface of the step portion 25 of the light-emitting device 11 and the mold resin 13. Moreover, a part of the second portion 15b is provided on the standing surface 25a of the step portion 25, and extends in the Y-direction. That is, the second portion 15b is located between the standing surface 25a and the mold resin 13, and makes the standing surface 25a and the mold resin 13 adhere to each other by a molecular bond.

If the passivation film is provided on the second surface 11b of the light-emitting device 11, the second portion 15b exists between the passivation film and the mold resin 13. Such a case is also included in the terms herein that "the molecular adhesion layer is provided between the second surface of the light-emitting device and the mold resin" and that "the molecular adhesion layer makes the second surface of the light-emitting device and the mold resin adhere to each other".

The third portion 15c exists between the third surface 11c (i.e., side surface) of the light-emitting device 11 and the mold resin 13, and extends in the Y-direction. The third portion 15c is formed in substantially the whole area of the third surface 11c of the light-emitting device 11. The third portion 15c makes the third surface 11c of the light-emitting device 11 and the mold resin 13 adhere to each other by a molecular bond.

Further, in the present embodiment, all the above-described first to third portions 15a, 15b and 15c are continuously formed and are joined to each other. That is, the first and third portions 15a and 15c extending in the Y-direction and the second portion 15b extending in the X-direction are integrally formed.

Next, an example of a manufacturing method of the electronic component 1 will be described.

Figure 3:
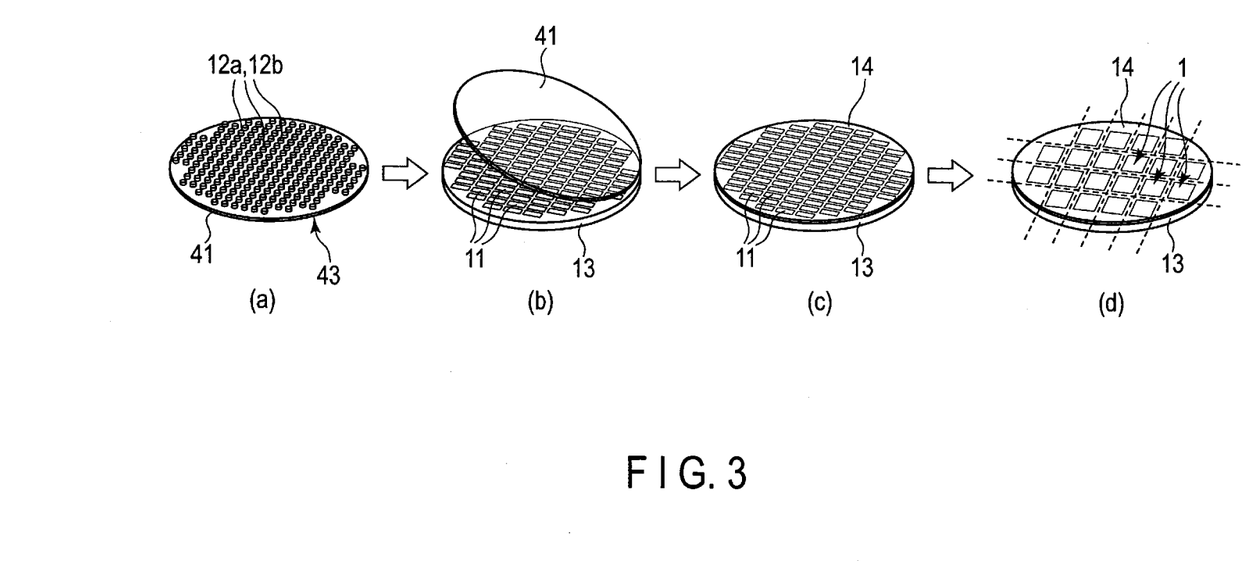
FIG. 3 is a perspective view showing a whole procedure of a manufacturing process of the electronic component shown in FIG. 1.
Figure 4:
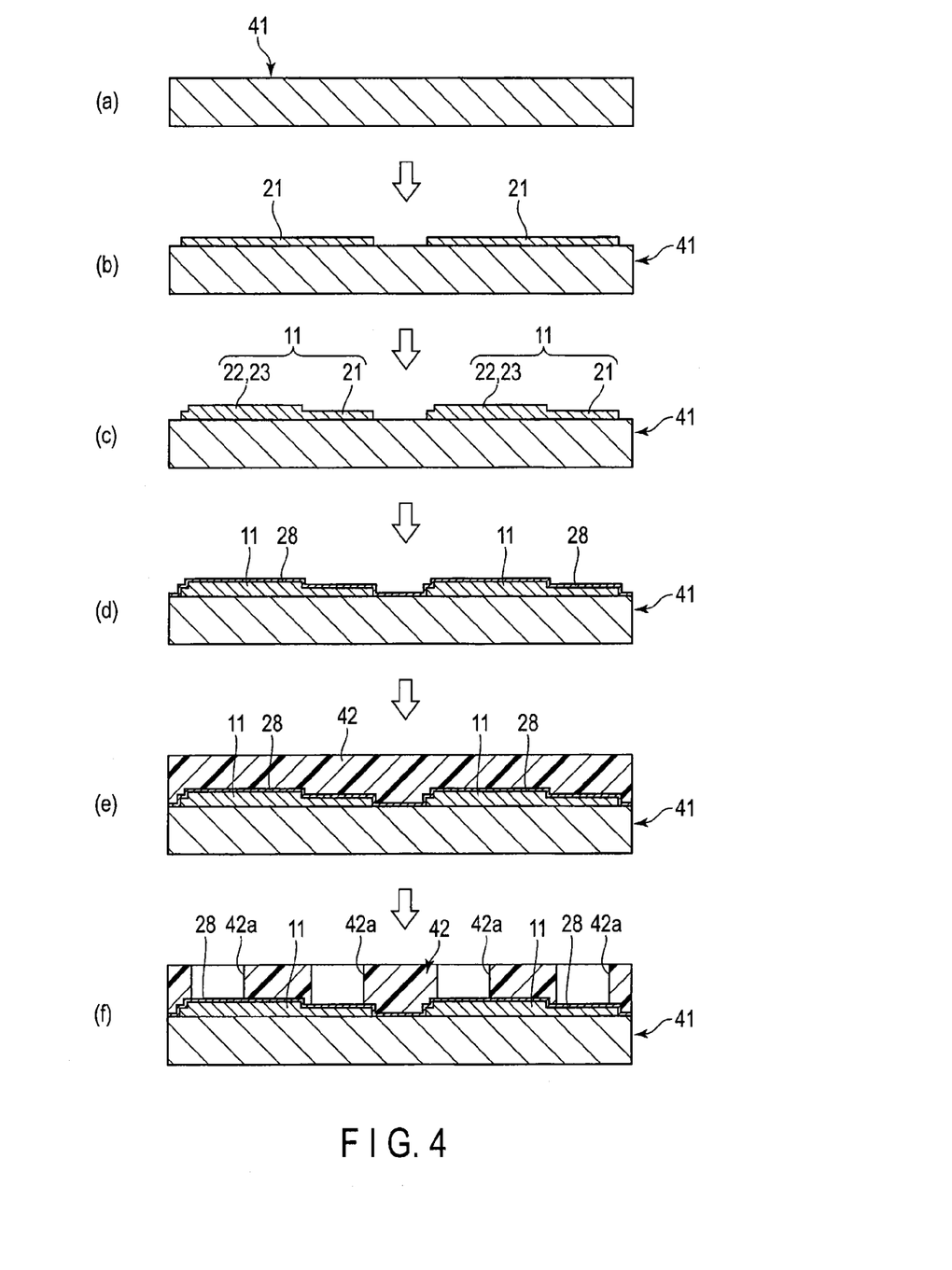
FIG. 4 is a cross-sectional view showing a part of the procedure of the manufacturing process of the electronic component shown in FIG. 1.
Figure 5:
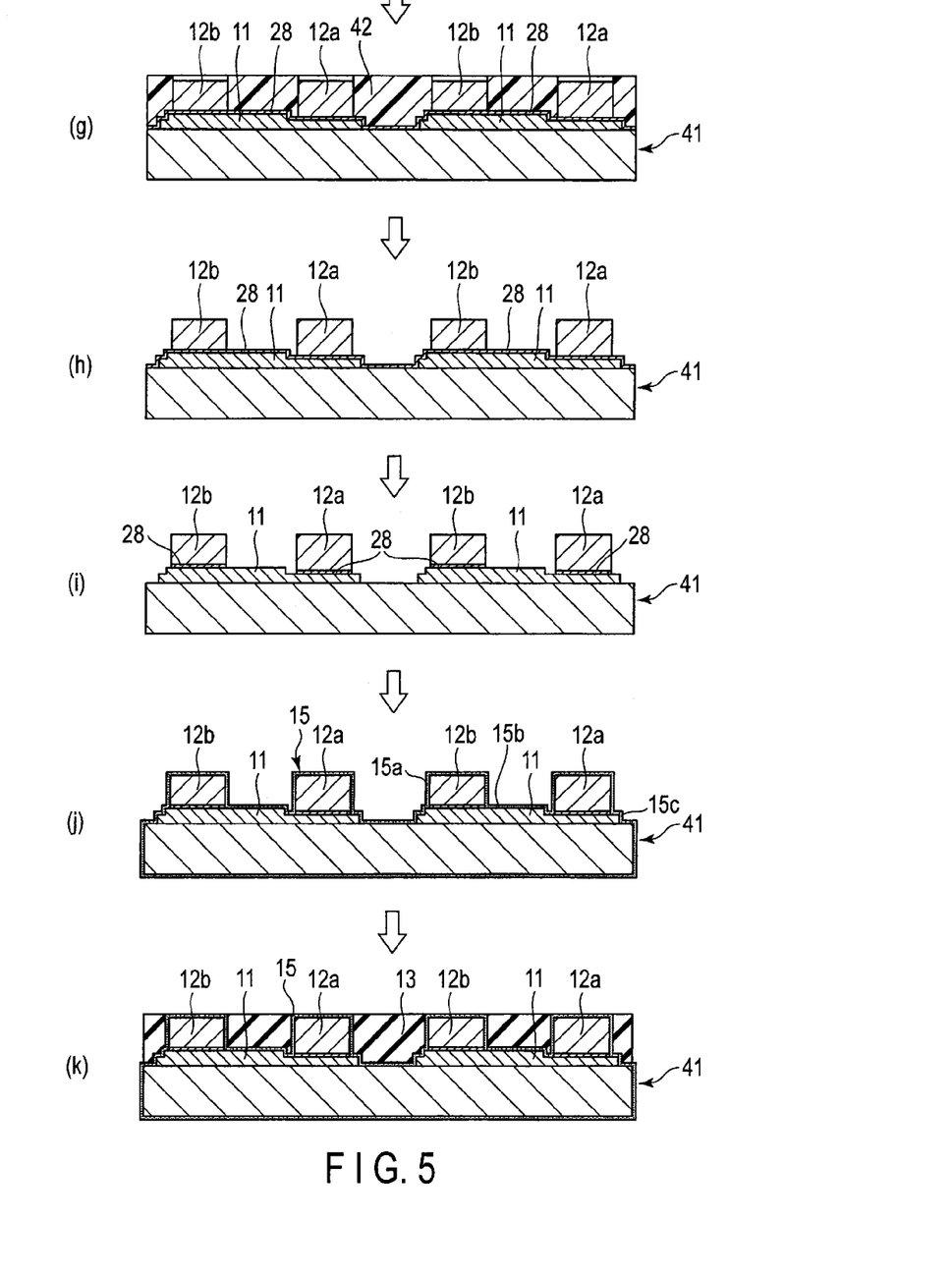
FIG. 5 is a cross-sectional view showing a part of the procedure of the manufacturing process of the electronic component shown in FIG. 1.
Figure 6:
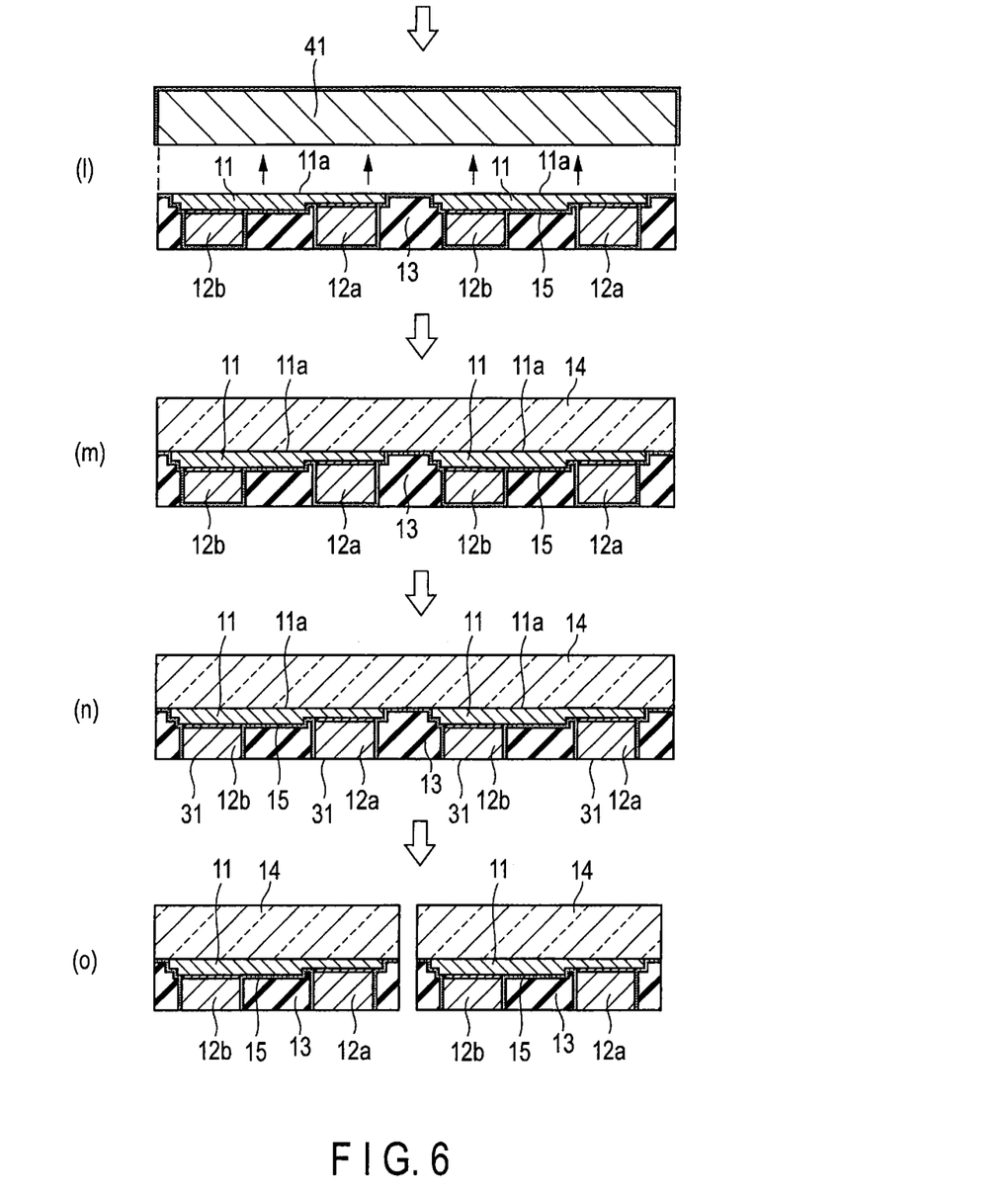
FIG. 6 is a cross-sectional view showing a part of the procedure of the manufacturing process of the electronic component shown in FIG. 1.

FIG. 3 shows a whole procedure of the manufacturing method of the electronic component 1. FIG. 4 to FIG. 6 show the details of each step of the manufacturing method of the electronic component 1.

In an example of the manufacturing method, as shown in FIG. 4, first, a wafer 41 as a base material is prepared (FIG. 4(a)). In the present embodiment, the wafer 41 is, for example, a silicon wafer but is not limited to this, and may be, for example, a sapphire wafer or another base material. The wafer 41 is formed in, for example, a substantially discoid.

Next, a thin film of the first cladding layer 21 is formed on the wafer 41 (FIG. 4(b)). Then, the active layer 23 and the second cladding layer 22 are formed on the first cladding layer 21 (FIG. 4(c)). The light-emitting device 11 is thereby formed.

Next, the seed layer 28 is formed, for example, on substantially the whole surface of the wafer 41 (FIG. 4(d)). The seed layer 28 is provided, for example, by forming a laminated film such as Ti/Cu through spattering or vapor deposition.

Next, a resist layer 42 serving as a sacrificial layer is formed, for example, on substantially the whole surface of the wafer 41 (FIG. 4(e)). As the resist layer 42, for example, a photosensitive liquid resist or a dry film resist can be used. Then, openings 42a corresponding to the metal electrodes 12a and 12b are opened in the resist layer 42, for example, by exposure and developing (FIG. 4(f)).

FIG. 5 shows steps following the steps of FIG. 4. As shown in FIG. 5, after the openings 42a are formed in the resist layer 42, plated layers serving as the metal electrodes 12a and 12b are formed in the openings 42a, for example, by an electroplating method (FIG. 5(g)). Then, the resist layer 42 is peeled and removed from the wafer 41 (FIG. 5(h)). After that, the seed layer 28 is removed, for example, by acid cleaning (FIG. 5(i)). An intermediate product 43 shown in FIG. 3(a) is thereby completed.

Next, the molecular adhesion layer 15 is formed by adding a molecular adhesive to the surfaces of the metal electrodes 12a and 12b and the like (FIG. 5(j)). The molecular adhesion layer 15 may be formed, for example, by dipping the above-described intermediate product 43 in a solution in which a molecular adhesive is dissolved, or may be formed, for example, by spraying a molecular adhesive in a jet over the surface of the above-described intermediate product 43 and the like.

Next, the mold resin 13 is provided to cover the metal electrodes 12a and 12b provided with the molecular adhesion layer 15 (FIG. 5(k)). The mold resin 13 chemically reacts with the molecular adhesion layer 15 to bond firmly with the molecular adhesion layer 15. The surfaces of the metal electrodes 12a and 12b and the mold resin 13 are thereby firmly bonded by the molecular adhesion layer 15.

Figure 9:
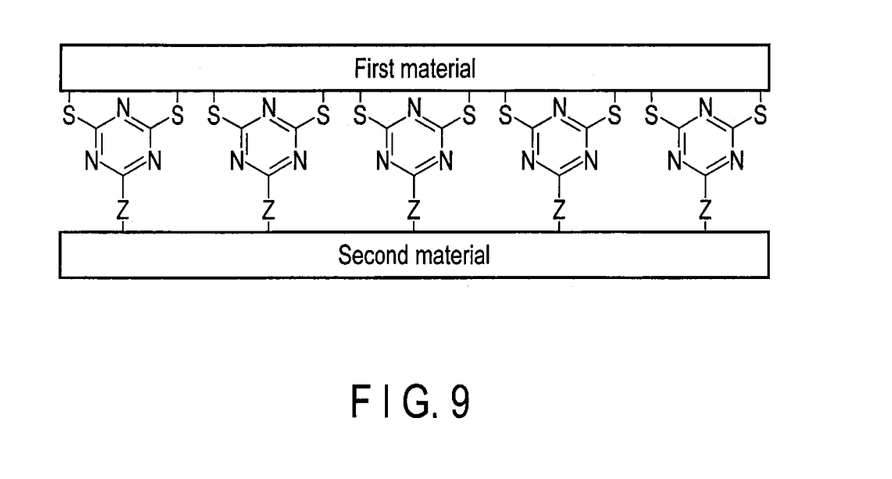
FIG. 9 is an illustration schematically showing an example of a composition of a molecular adhesion layer.

FIG. 6 shows steps following the steps of FIG. 5. As shown in FIG. 3 and FIG. 6, after the molecular adhesion layer 15 is formed, the wafer 41 is removed (FIG. 3(b), FIG. 6(l)). In the intermediate product 43, the light-emitting device 11 is thereby exposed to the outside. Next, the fluorescent layer 14 is provided to cover the first surface 11a of the light-emitting device 11 (FIG. 3(c), FIG. 6(m)). Then, the surface (e.g., bottom surface) of the intermediate product 43 is grinded to expose the end surface 31 of the metal electrodes 12a and 12b to the outside of the mold resin 13 (FIG. 6(n)). Next, the intermediate product 43 is segmented by dicing (FIG. 3(d), FIG. 6(o)). The electronic component 1 is thereby obtained. In the electronic component 1, the molecular adhesion layer 15 includes, for example, a triazine dithiol residue as shown in FIG. 9. An example of "Z" in FIG. 9 is an aminohydrocarbyl siloxy group.

According to the electronic component 1 having such a structure, reliability can be further improved. Here, if a small air space exists between the surfaces of the metal electrodes 12a and 12b and the mold resin 13, although no problem will arise in general use, the air space expands under the influence of heat, etc., and the reliability of the electronic component 1 may be influenced, for example, when it is used in a hostile environment. To avoid this influence, for example, it may be conceivable to roughen the surfaces of the metal electrodes 12a and 12b to increase adhesive force between the metal electrodes 12a and 12b and the mold resin 13. However, this process of roughening the surfaces of the metal electrodes 12a and 12b may unnecessarily influence the light-emitting device 11.

Thus, in the electronic component 1 according to the present embodiment, the molecular adhesion layer 15 is provided between the surfaces of the metal electrodes 12a and 12b and the mold resin 13. According to such a structure, the metal electrodes 12a and 12b and the mold resin 13 are firmly bonded by the molecular adhesion layer 15 to increase adhesion (e.g., closeness, airlessness) between the surfaces of the metal electrodes 12a and 12b and the mold resin 13. Therefore, the possibility that an air space will appear between the surfaces of the metal electrodes 12a and 12b and the mold resin 13 can be more surely reduced. The reliability of the electronic component 1 can thereby further improved than ever.

In addition, according to the present embodiment, the process of roughening the surfaces of the metal electrodes 12a and 12b is unnecessary. This enables the possibility of unnecessarily influencing the light-emitting device 11 to be prevented, and further enables a resistance loss of the metal electrodes 12a and 12b due to a skin effect to be reduced. A power saving of the electronic component 1 also can be thereby achieved at the same time.

In the present embodiment, the molecular adhesion layer 15 is provided also between the second surface 11b of the light-emitting device 11 and the mold resin 13. According to such a structure, the light-emitting device 11 and the mold resin 13 are firmly bonded by the molecular adhesion layer 15 to increase adhesion between the surface of the light-emitting device 11 and the mold resin 13. Therefore, the possibility that an air space will appear between the surface of the light-emitting device 11 and the mold resin 13 can be more surely reduced. The reliability of the electronic component 1 can be thereby further improved.

In the present embodiment, the metal electrodes 12a and 12b comprise the peripheral surfaces 32 extending in the projecting direction of the metal electrodes 12a and 12b. The molecular adhesion layer 15 exists between the peripheral surface 32s of the metal electrodes 12a and 12b and the mold resin 13, and firmly bonds the peripheral surfaces 32 of the metal electrodes 12a and 12b and the mold resin 13. Here, each of the peripheral surfaces 32 of the metal electrodes 12a and 12b extends in a substantially orthogonal direction to the second surface 11b of the light-emitting device 11, and thus, is one of the portions to which an adhesive, etc., are not easily added uniformly. However, the molecular adhesion layer 15 is easily added to the peripheral surfaces 32 like these uniformly, and thus can be appropriately provided between the peripheral surfaces 32 of the metal electrodes 12a and 12b and the mold resin 13.

In the present embodiment, the molecular adhesion layer 15 comprises the first portion 15a existing between the peripheral surfaces 32 of the metal electrodes 12a and 12b and the mold resin 13 and the second portion 15b existing between the second surface 11b of the light-emitting device 11 and the mold resin 13, and the first portion 15a and the second portion 15b are continuously formed. According to such a structure, in the molecular adhesion layer 15, the first portion 15a extending in the Y-direction and the second portion 15b extending in the X-direction form an integral connection portion, and the bond between the light-emitting device 11 and each of the metal electrodes 12a and 12b, and the mold resin 13 can be thereby further strengthened.

In the present embodiment, the molecular adhesion layer 15 is provided also between the third surface 11c (i.e., side surface) of the light-emitting device 11 and the mold resin 13. According to such a structure, the bond between the light-emitting device 11 and the mold resin 13 can be further strengthened.

In the present embodiment, the light-emitting device 11 comprises the step portion 25. The molecular adhesion layer 15 is provided also between the surface of the step portion 25 and the mold resin 13. According to such a structure, even at such a portion as the step portion 25 where the adhesion between the light-emitting device 11 and the mold resin 13 would tend to become small, the bond between the light-emitting device 11 and the mold resin 13 can be strengthened.

Figure 7:
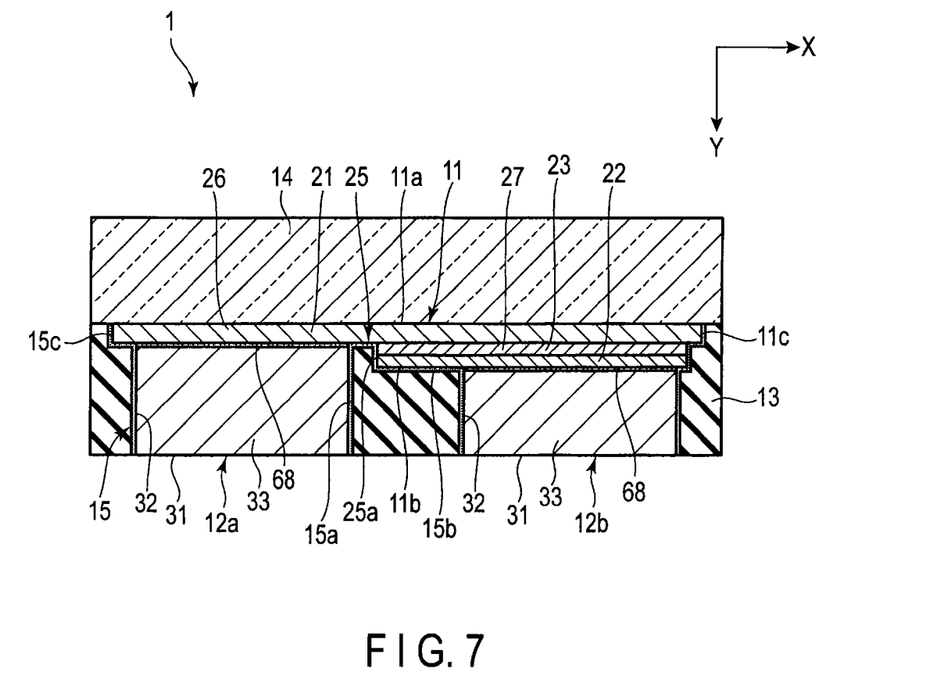
FIG. 7 is a cross-sectional view of a modification of the electronic component according to the first embodiment.

FIG. 7 shows the electronic component 1 of a modification according to the present embodiment. In the modification, a second molecular adhesion layer 68 is provided instead of the seed layer 28. A composition of the second molecular adhesion layer 68 is substantially the same as that of the first molecular adhesion layer 15. By providing the molecular adhesion layer 68 like this and adding a catalyst such as palladium, the electrodes 12a and 12b can be formed on the molecular adhesion layer 68 by plating, etc. Such a step as sputtering for forming the seed layer 28, which is relatively expensive, can be thereby omitted. The cost of the electronic component 1 can be thereby reduced.

Second Embodiment

Next, an electronic unit 51 according to a second embodiment will be described. Structures having the same or similar functions as or to those of the first embodiment will be given the same numbers, and explanations thereof will be omitted. In addition, the structures other than those described hereinafter are the same as those of the first embodiment.

Figure 8:
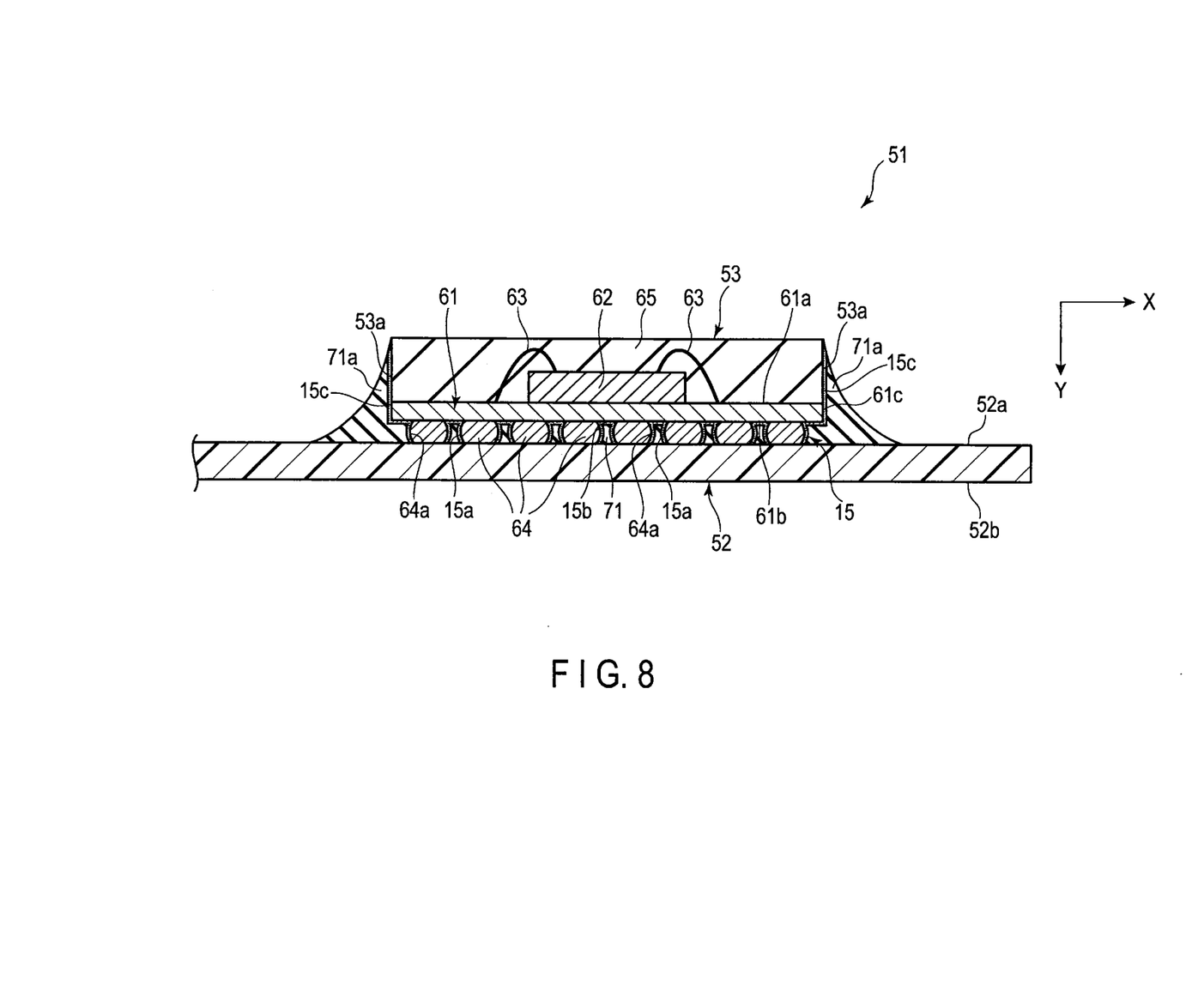
FIG. 8 is a cross-sectional view of an electronic unit according to a second embodiment.

FIG. 8 shows the electronic unit 51 according to the present embodiment. The electronic unit 51 includes, for example, a circuit board 52 and an electronic component 53 mounted on the circuit board 52. The electronic unit 51 is an example of each of an electronic apparatus, an electronic system and a system. The electronic component 53 is an example of a component.

The circuit board 52 is a printed circuit board, and comprises a first surface 52a and a second surface 52b located on the opposite side to the first surface 52a. On the first surface 52a, pads to which the electronic component 53 is connected are provided.

As shown in FIG. 8, an example of the electronic component 53 is a BGA semiconductor package, and comprises a board 61, a semiconductor device 62, bonding wires 63, and a plurality of solder balls 64. The board 61 is an inner board of the electronic component 53, and comprises a first surface 61a, a second surface 61b located on the opposite side to the first surface 61a, and a third surface 61c connecting an edge of the first surface 61a and an edge of the second surface 61b.

On the first surface 61a, the semiconductor device 62 is placed. The semiconductor device 62 is electrically connected to the first surface 61a of the board 61 by the bonding wires 63. In addition, on the first surface 61a of the board 61, a mold resin 65 (i.e., sealing resin) is provided. The mold resin 65 integrally seals the semiconductor device 62 and the bonding wires 63.

The second surface 61b of the board 61 is an example of a bottom surface (i.e., back surface) of the electronic component 53. In the present embodiment, the second surface 61b of the board 61 is exposed to the outside of the mold resin 65, and is provided with the plurality of solder balls 64. The solder balls 64 are electrically connected to the board 61 and are connected to the pads of the circuit board 52.

As shown in FIG. 8, an underfill 71 is provided between the electronic component 53 and the circuit board 52. The underfill 71 is an example of each of a sealing resin, a resin portion, an insulating resin portion, an insulating portion and a reinforcement portion. The underfill 71 surrounds the plurality of solder balls 64. In addition, the underfill 71 is provided between the plurality of solder balls 64 to insulate the plurality of solder balls 64 from each other, and fills a space between the second surface 61b of the board 61 and the first surface 52a of the circuit board 52.

On the other hand, the electronic component 53 comprises a side surface 53a extending in the thickness direction of the electronic component 53 (i.e., the thickness direction of the circuit board 52). The side surface 53a is formed by, for example, the mold resin 65 and the third surface 61c of the board 61. Also, all the side surface 53a may be composed of the mold resin 65. The underfill 71 comprises a fillet 71a (i.e., a portion formed in the shape of an arc by surface tension) covering at least a part of the side surface 53a of the electronic component 53.

As shown in FIG. 8, in the present embodiment, the molecular adhesion layer 15 exists between the surfaces of the solder balls 64 or the like and the underfill 71. More specifically, the molecular adhesion layer 15 comprises a first portion 15a, a second portion 15b and a third portion 15c.

The first portion 15a exists between peripheral surfaces 64a (i.e., side surfaces) of the solder balls 64 and the underfill 71, and makes the peripheral surfaces 64a of the solder balls 64 and the underfill 71 adhere to each other by a molecular bond. The second portion 15b exists between the second surface 61b of the board 61 (i.e., bottom surface of the electronic component 53) and the underfill 71, and makes the second surface 61b of the board 61 and the underfill 71 adhere to each other by a molecular bond. The third portion 15c exists between the side surface 53a of the electronic component 53 and the fillet 71a, and makes the side surface 53a of the electronic component 53 and the fillet 71a adhere to each other by a molecular bond. Also, in the present embodiment, the first to third portions 15a, 15b and 15c are continuously formed.

According to the electronic unit 51 having such a structure, the reliability can be further improved as in the first embodiment. That is, the present embodiment comprises the molecular adhesion layer 15 existing between the surface of the electronic component 53 and the underfill 71. According to such a structure, the adhesion between the surface of the electronic component 53 and the underfill 71 can be increased, and the possibility that an air space will appear between the surface of the electronic component 53 and the underfill 71 can be more surely reduced. The reliability of the electronic unit 51 can be thereby further improved than ever.

In the present embodiment, the molecular adhesion layer 15 exists between the surfaces of the solder balls 64 and the underfill 71. According to such a structure, the adhesion between the surfaces of the solder balls 64 and the underfill 71 can be increased. The reliability of the electronic unit 51 can be thereby further improved.

In the present embodiment, the molecular adhesion layer 15 exists between the side surface 53a of the electronic component 53 and the fillet 71a of the underfill 71. According to such a structure, the adhesion between the side surface 53a of the electronic component 53 and the fillet 71a can be increased. The reliability of the electronic unit 51 can be thereby further improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic component comprising:
   a semiconductor device;
   a metal electrode provided on and electrically connected to the semiconductor device;
   a mold resin provided in a periphery of the metal electrode, the mold resin covering at least a part of the semiconductor device and at least a part of the metal electrode; and
   a molecular adhesion layer provided between a surface of the metal electrode and the mold resin,
   wherein the semiconductor device comprises a first surface and a second surface located on an opposite side to the first surface, the second surface being provided with the metal electrode,
   wherein the mold resin covers the second surface of the semiconductor device,
   wherein the molecular adhesion layer is provided between the second surface of the semiconductor device and the mold resin,
   wherein the molecular adhesion layer makes the surface of the metal electrode and the mold resin adhere to each other by a chemical bond, and the molecular adhesion layer makes the second surface of the semiconductor device and the mold resin adhere to each other by a chemical bond, and
   wherein the molecular adhesion layer comprises a triazine dithiol residue.

2. The electronic component of claim 1,
   wherein the semiconductor device is a light-emitting device.

3. The electronic component of claim 1 further comprising a fluorescent layer,
   wherein the fluorescent layer covers the first surface of the semiconductor device.

4. The electronic component of claim 3,
   wherein the metal electrode projects in a substantially orthogonal direction to the second surface and comprises a peripheral surface extending in a projecting direction of the metal electrode,
   the mold resin covers the peripheral surface of the metal electrode, and
   the molecular adhesion layer is provided between the peripheral surface of the metal electrode and the mold resin.

5. The electronic component of claim 4,
   wherein the molecular adhesion layer comprises a first portion provided between the peripheral surface of the metal electrode and the mold resin and a second portion provided between the second surface of the semiconductor device and the mold resin, and the first portion and the second portion are continuously formed.

6. The electronic component of claim 3,
   wherein the semiconductor device comprises a side surface connecting an edge of the first surface and an edge of the second surface,
   the mold resin covers the side surface of the semiconductor device, and
   the molecular adhesion layer is provided also between the side surface of the semiconductor device and the mold resin.

7. The electronic component of claim 3,
   wherein the semiconductor device comprises a first portion having a first thickness, a second portion having a second thickness, and a step portion located between the first portion and the second portion,
   the mold resin covers the step portion, and
   the molecular adhesion layer is provided also between a surface of the step portion and the mold resin.

8. The electronic component of claim 1,
   wherein the electronic component is a wafer level package.

9. The electronic component of claim 1,
   wherein the metal electrode comprises an exposed surface, and
   wherein the molecular adhesion layer is not provided on the exposed surface of the metal electrode.

10. The electronic component of claim 1,
    wherein the semiconductor device comprises a first portion having a first thickness and a second portion having a second thickness, and
    wherein the first thickness is less than the second thickness.

11. An electronic component comprising:
    a metal portion provided on and electrically connected to the electronic component;
    a mold resin covering at least a part of the metal portion;
    a molecular adhesion layer provided between a surface of the metal portion and the mold resin;
    a first surface; and
    a second surface located on an opposite side to the first surface, the second surface being provided with the metal portion,
    wherein the mold resin covers the second surface,
    wherein the molecular adhesion layer is provided between the second surface and the mold resin, wherein the molecular adhesion layer makes the surface of the metal portion and the mold resin adhere to each other by a chemical bond, and the molecular adhesion layer makes the second surface of the electronic component and the mold resin adhere to each other by a chemical bond, and wherein the molecular adhesion layer comprises a triazine dithiol residue.

12. The electronic component of claim 11 further comprising a component main body provided with the metal portion, wherein the mold resin covers at least a part of the component main body, and the molecular adhesion layer is provided also between a surface of the component main body and the mold resin.

13. The electronic component of claim 11, wherein the metal portion comprises an exposed surface, and wherein the molecular adhesion layer is not provided on the exposed surface of the metal portion.

14. An electronic unit comprising:

a component;

a resin portion covering at least a part of the component;

a molecular adhesion layer provided between a surface of the component and the resin portion; and a circuit board on which the component is mounted, wherein the component comprises a solder ball that is electrically connected to the component and is connected to the circuit board, wherein the molecular adhesion layer is provided between a surface of the solder ball and the resin portion, wherein the molecular adhesion layer makes the surface of the component and the resin portion adhere to each other by a chemical bond, and the molecular adhesion layer makes the solder ball and the resin portion adhere to each other by a chemical bond, and wherein the molecular adhesion layer comprises a triazine dithiol residue.

15. The electronic unit of claim 14 wherein the resin portion is an underfill provided between the circuit board and the component and surrounding the solder ball.

16. The electronic unit of claim 15, wherein the component comprises a side surface, the underfill comprises a fillet covering at least a part of the side surface of the component, and the molecular adhesion layer is provided also between the side surface of the component and the fillet.

17. The electronic component of claim 14, wherein the circuit board comprises a surface connected to the component, and wherein the molecular adhesion layer is not provided on the surface connected to the component.

* * * * *